(12) United States Patent
Gallant

(10) Patent No.: US 7,440,254 B2
(45) Date of Patent: Oct. 21, 2008

(54) MICRO-ELECTROMECHANICAL VARIABLE CAPACITOR

(75) Inventor: Andrew James Gallant, Durham (GB)

(73) Assignee: RFMD (UK) Limited, Newton Aycliffe (GB)

( * ) Notice: Subject to any disclaimer, the term of this patent is extended or adjusted under 35 U.S.C. 154(b) by 257 days.

(21) Appl. No.: 10/518,737

(22) PCT Filed: Jun. 9, 2003

(86) PCT No.: PCT/GB03/02495

§ 371 (c)(1),
(2), (4) Date: Jul. 30, 2005

(87) PCT Pub. No.: WO04/000717

PCT Pub. Date: Dec. 31, 2003

(65) Prior Publication Data
US 2006/0012343 A1  Jan. 19, 2006

(30) Foreign Application Priority Data
Jun. 19, 2002 (GB) .................... 0214206.5

(51) Int. Cl.
*H01G 7/00* (2006.01)
(52) U.S. Cl. .................. 361/277; 361/272; 361/278; 361/283.3; 361/290; 361/292
(58) Field of Classification Search ............... 361/277, 361/278, 272–273, 283.3, 290–292
See application file for complete search history.

(56) References Cited

U.S. PATENT DOCUMENTS

| 6,162,657 | A | 12/2000 | Schiele et al. | 438/52 |
|---|---|---|---|---|
| 6,242,989 | B1 * | 6/2001 | Barber et al. | 331/177 V |
| 6,351,020 | B1 * | 2/2002 | Tarabbia et al. | 257/532 |
| 6,418,006 | B1 * | 7/2002 | Liu et al. | 361/277 |
| 6,608,747 | B1 * | 8/2003 | Ito | 361/277 |
| 6,737,929 | B1 * | 5/2004 | Cui et al. | 331/177 V |
| 6,856,499 | B2 * | 2/2005 | Stokes | 361/277 |

FOREIGN PATENT DOCUMENTS

| JP | 07036189 | 1/1995 |
|---|---|---|
| WO | PCT/EP97/06174 | 11/1997 |
| WO | PCT/IB00/02051 | 11/2000 |
| WO | PCT/FI01/00152 | 2/2001 |
| WO | PCT/US01/44472 | 11/2001 |

OTHER PUBLICATIONS

Jun Zou, et al., Development of a Wide Tuning Range MEMS Tunable Capacitor for Wireless Communication Systems, Department of Electrical & Computer Engineering, University of Illinois, date unknown.

* cited by examiner

*Primary Examiner*—Nguyen T Ha
(74) *Attorney, Agent, or Firm*—Withrow & Terranova, PLLC

(57) ABSTRACT

A micro-electromechanical variable capacitor with first and second capacitor plates spaced apart to define a gap therebetween. The first plate has two control electrodes and an active electrode. The second plate is movable relative to first plate when a voltage is applied to produce a potential difference across the control electrode and the second capacitor plate. This has the effect of varying the capacitance of the capacitor. The facing surface of at least one of the plates is formed in such a way that it has a roughened surface. The degree of roughness is sufficient to prevent the facing surfaces adhering together through stiction.

23 Claims, 6 Drawing Sheets

MICRO-ELECTROMECHANICAL VARIABLE CAPACITOR

FIELD OF THE INVENTION

The present invention relates to a micro-electromechanical (MEM) variable capacitor and a method for fabricating the same.

BACKGROUND OF THE INVENTION

MEM variable capacitors are expected to be particularly suitable in microwave and millimetre wave applications such as, for example, tunable filters and voltage controlled oscillators where a high quality factor (Q) and a wide tuning range are desirable.

A MEM variable capacitor comprises a pair of electrodes: a fixed electrode that is mounted on a substrate and a movable electrode that is suspended over the fixed electrode to define an air gap between facing planar surfaces of the electrodes. When a DC control voltage is applied across the electrodes the moveable electrode moves toward the fixed electrode under electrostatic attraction. This reduces the air gap between the electrodes and increases the capacitance. The motion of the moveable electrode is restricted by a mechanical spring force. The spring force is directly proportional to the distance travelled by the moveable electrode (i.e. the reduction in the original air gap) whereas the electrostatic attractive force has a non-linear relationship with the air gap.

It can be shown mathematically that when the air gap is less than two-thirds of the initial air gap distance the electrostatic attractive force exceeds the spring force and the electrodes are pulled together. The control voltage at which this occurs is known as the "pull-in" voltage. This limits the capacitance tuning ratio to 1.5:1 which is inadequate for many applications.

Even to achieve a tuning ratio of 1.5:1 requires the operation of the device at voltages close to the pull-in voltage and therefore it is often the case that pull-in occurs. When this happens the facing planar surfaces come into contact with each other and often adhere together after the applied voltage has been removed as a result of stiction. This results in device failure. Stiction between the facing planar surfaces also leads to low yields when such devices are being fabricated.

One known approach to improving the capacitance ratio of a MEM variable capacitor is disclosed in WO 01/61848. As in the device described above a moveable electrode is anchored at each end so as to be suspended above a fixed electrode but is flexible so that it deflects when the control voltage is applied. The fixed electrode is, however, split such that here is a central active electrode that combines with the movable electrode to form the variable capacitor and two outer control electrodes to which the control voltage is applied. The central electrode is located midway between the anchors where the deflection of the flexible electrode is greatest. The electrodes are arranged so that the gap between the central electrode and the flexible electrode is less than that between the control electrodes and the flexible electrode. In operation, the maximum deflection of the flexible electrode is limited by the distance between it and the control electrodes. The minimum distance between the deflected flexible electrode and the control electrodes to avoid pull-in is again two thirds of the initial gap. If the gap between the central electrode and the flexible electrode is made less than one third of that between the control electrodes and the flexible electrode then the pull-in voltage does not limit the tuning range.

The device described in WO 01/61848 does provide a wider tuning ratio range, but pull-in still occurs in some circumstances and stiction resulting in device failure is therefore still a problem during both use and manufacture.

A paper published after a conference in San Francisco 10-13 Dec. 2000 (Development of a Wide Tuning Range MEMS Tunable Capacitor for Wireless Communication Systems, Jun Zou; Chang Liu; Schutt-Aine,J; Jinghong Chen, and Sung-Mo Hung 0-7803-6441-4/00) describes the performance of a device of the same general type as that described in WO 01/61848. The paper notes that, in a test device, after pull-in had occurred the spacing between the facing surfaces could not be reduced to zero, suggesting by way of explanation "Possible reasons are surface roughness of the two plates, the existence of residual film from sacrificial layer etching, or absolute measurement calibration". The same paper also refers to the achievable tuning range value being dependent upon "other factors, such as surface roughness and curvature". The facing surfaces of the capacitor plates are however fabricated using a process which relies upon the deposition of layers of material by thermal evaporation which will, if performed successfully, result in smooth surfaces and thus references to "roughness" in the paper are concerned with manufacturing errors rather than a deliberate attempt to achieve a surface which is not smooth.

SUMMARY OF THE INVENTION

It is an object of the present invention to obviate or mitigate the problems outlined above.

According to a first aspect of the present invention there is provided micro-electromechanical variable capacitor comprising first and second capacitor plates defining facing surfaces which are spaced apart to define a gap, and means for applying a potential difference across the gap, at least one of the plates being movable relative to the other such that when a potential is applied across the gap the width of the gap is varied as a function of the applied potential so as to vary the capacitance of the capacitor, wherein the facing surface of at least one plate has a roughened surface, the degree of roughness being sufficient to prevent the facing surfaces adhering together.

The means for applying a potential difference may be configured to apply the potential difference across the facing surfaces of the plates. Alternatively, the first capacitor plate defines at least one control electrode and the means for applying a potential difference is configured to apply the potential difference across the (or each) control electrode and the second plate.

The first capacitor plate may define an active electrode on which said facing surfaces is defined. The gap between the active electrode and the second capacitor plate is ideally less than that between the (or each) control electrode and the second capacitor plate. The active electrode is preferably disposed between two control electrodes and ideally in a central position.

The second capacitor plate may be movable and the first capacitor plate fixed. The second plate is preferably flexible and is movable by virtue of its flexibility. Preferably the second plate comprises a pair of anchor members that are fixed relative to the first plate and an intermediate portion that is flexible and moveable. The intermediate portion of the second plate is substantially planar.

The facing surface of the first plate has a roughened surface and/or the facing surface of the second plate has a roughened surface. The roughened surface of the facing surface of the second plate may be dissimilar to the roughened surface of the facing surface of the first plate. The dissimilarity may at least in part be caused by the action of a sacrificial material used in the fabrication process. The dissimilarity may at least in part be caused by electroplating.

The first plate may be fixed to a substrate.

At least the facing surface of the (or each) plate with a roughened surface is fabricated from any metal using an electroplating process such as, for example, electroplating nickel or gold.

At least the facing surface of the active electrode is ideally fabricated by electroplating.

According to a second aspect of the present invention there is provided a method for fabricating a micro-electromechanical variable capacitor having first and second capacitor plates defining facing surfaces which are spaced apart to define a gap, and means for applying a potential difference across the gap, at least one of the plates being movable relative to the other such that when a potential is applied across the gap the width of the gap is varied as a function of the applied potential so as to vary the capacitance of the capacitor, the method comprising the step of fabricating at least one plate with a roughened facing surface, the degree of roughness being sufficient to prevent the facing surfaces adhering together.

Preferably the method further comprises the steps of fabricating the first plate with a roughened surface, fabricating an overlying intermediate layer such that the roughness of the facing surface is repeated on an upper surface of the intermediate layer and then fabricating the second plate over the intermediate layer such that its facing surface is formed with an inverse of the upper surface of the intermediate layer, and then removing the intermediate layer.

At least the facing surface of the first plate may be fabricated by electroplating and/or at least the facing surface of the second plate may be fabricated by electroplating.

The intermediate layer may be removed by etching. In one embodiment the intermediate layer is fabricated from titanium. The sacrificial layer may introduce further roughness to the facing surface of the second plate.

BRIEF DESCRIPTION OF THE DRAWING FIGURES

A specific embodiment of the present invention will now be described, by way of example only, with reference to the accompanying drawings in which.

DETAILED DESCRIPTION OF THE PREFERRED EMBODIMENTS

Figure 1:
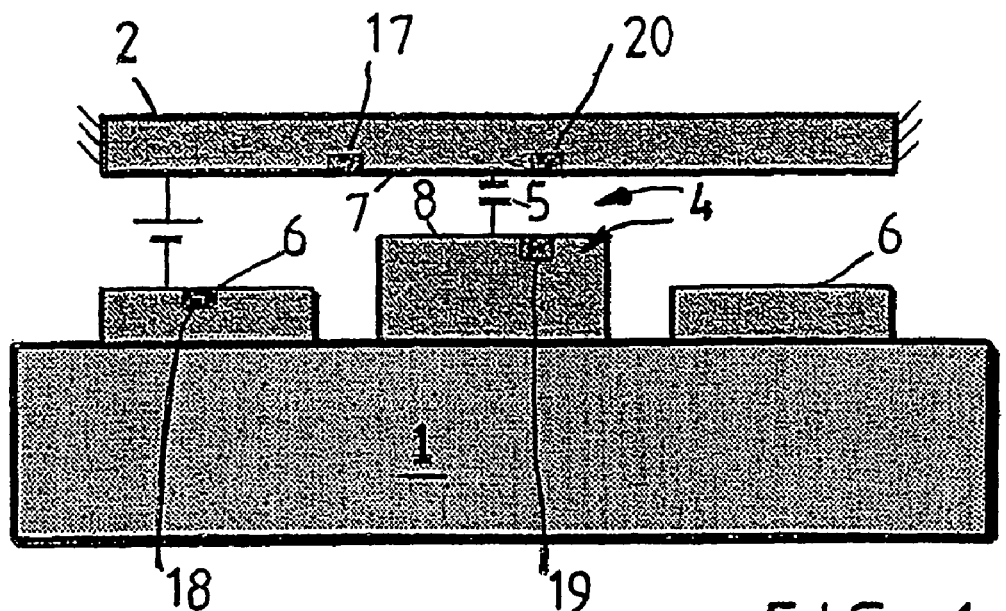
FIG. 1 is a schematic representation of the variable capacitor of the present invention.
Figure 2:
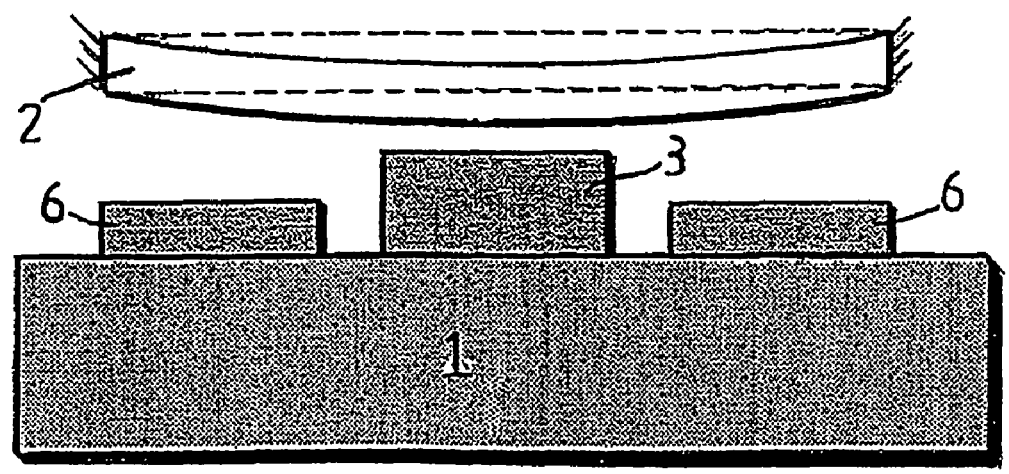
FIG. 2 is a schematic representation of the capacitor of FIG. 1 shown with an upper electrode deflected.

Referring first to FIGS. 1 and 2 of the drawings, the illustrated micro-electromechanical capacitor is fabricated on a substrate 1 and has a pair of spaced capacitor plates in the form of an upper electrode 2 suspended over a lower electrode 3 so as to define an intermediate air gap 4. The lower electrode 3 is formed on the substrate 1. The electrodes 2 and 3 together define a variable capacitor as represented by the symbol labelled 5.

The lower electrode 3 is disposed between a pair of outer bias electrodes 6. The electrode 3 is thicker than the bias electrodes 6 so that the air gap 4 between the upper and lower electrodes 2,3 is smaller than the gap between the upper and bias electrodes 2, 6.

The upper electrode 2 is anchored at each end but is flexible so that it may deflect relative to the substrate 1. When a DC voltage V is applied between the upper and bias electrodes 2, 6, electrostatic attraction causes the upper electrode 2 to deflect downwardly towards the lower electrode 3 as is illustrated in FIG. 2. This reduces the air gap 4 and thereby increases the capacitance. The bias voltage is changed to vary the amount of deflection and therefore the capacitance value.

The lower surface 7 of the upper electrode 2 and the upper surface 8 of the lower electrode 3 are roughened by methods that will be described below. The roughened surfaces reduce the tendency for stiction, thereby improving the reliability of such capacitors.

Figure 3:
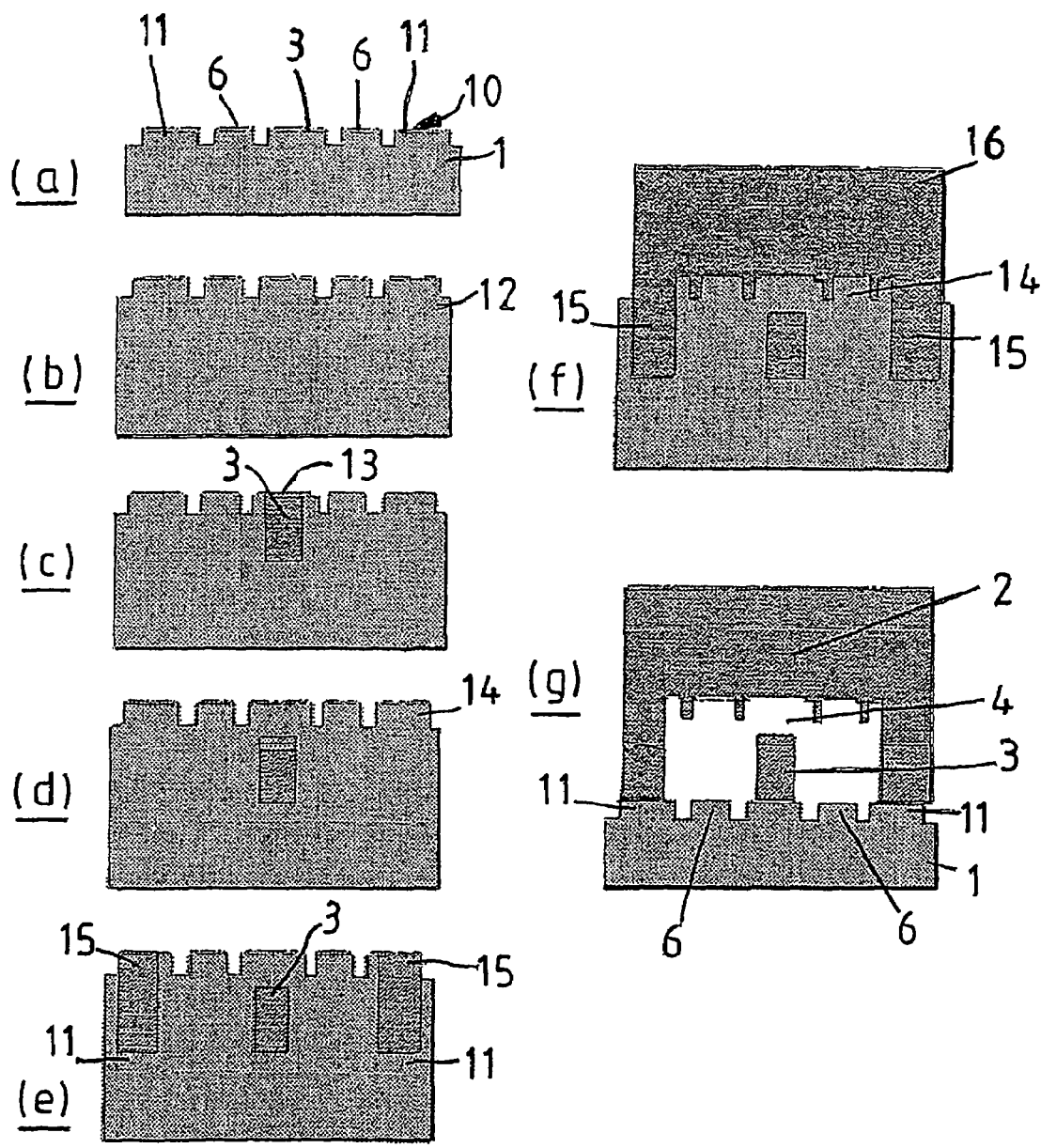
FIGS. 3a to 3g illustrate the steps in fabricating a capacitor having nickel electrodes, in accordance with the present invention.

FIGS. 3a to 3g illustrate the fabrication process of the variable capacitor. First, 0.03 μm of nickel 10 is e-beam evaporated on to a clean silicon substrate 1 and patterned by conventional photoresist deposition/exposure techniques to form bases for the lower electrode 3, the bias electrodes 6 and anchor pads 11 for the upper electrode 2 (FIG. 3a). A 0.2 μm layer of titanium 12 is then deposited using e-beam evaporation (FIG. 3b) and a hole is etched through the titanium to the nickel layer forming the base for the lower electrode 3. Using a nickel sulfamate based electroplating bath, 0.2 μm of nickel is then electroformed into the hole to create the thick lower electrode 3 (FIG. 3c). The evaporated nickel at the base of the hole acts as a seed layer for the electroplating. By controlling the electroplating process, a roughened surface finish 13 is applied to the thick lower electrode 3. The electroplating process introduces surface roughness variations which are not achievable or controllable through evaporation. The roughness of electroplated metals depends upon (and can therefore by controlled by adjusting) the electroplating time, current density, electroplating seed, electroplating bath solution, temperature and ultimately thickness of the deposit.

A further 0.1 μm of titanium 14 is then e-beam evaporated (FIG. 3d). It is this layer that defines the spacing between the central electrode 3 and the upper electrode of FIGS. 1 and 2.

Holes are etched above the anchor pads 11, and the holes are filled with 0.3 μm of nickel 15 by electroforming (FIG. 3e). A further 0.31 μm of nickel 16 is added across the full width of the structure by electroplating (FIG. 3f). The electroplated nickel 15 previously deposited over the anchor pads 11 and the evaporated titanium 14 both serve as an electroplating seed. This nickel layer 16 forms the upper electrode 2. The titanium layer 14 is such that the roughness of the surface of the lower electrode 3 is propagated through to succeeding layers. Thus the upper surface of the titanium layer 14 has the same roughness in the region directly over the central electrode 3 as the surface 13 of the lower electrode 3 and this roughness is carried through (in complementary form) to the underside of the subsequent electroplated nickel 16. Finally, the titanium layer 14 is etched by hydrofluoric acid solution followed by rinsing in isopropyl alcohol that is allowed to evaporate at 90° to leave the air gap 4 between the upper 2 and lower electrodes 3 and a wider gap between the upper electrode 2 and the bias electrodes 6.

Figure 4:
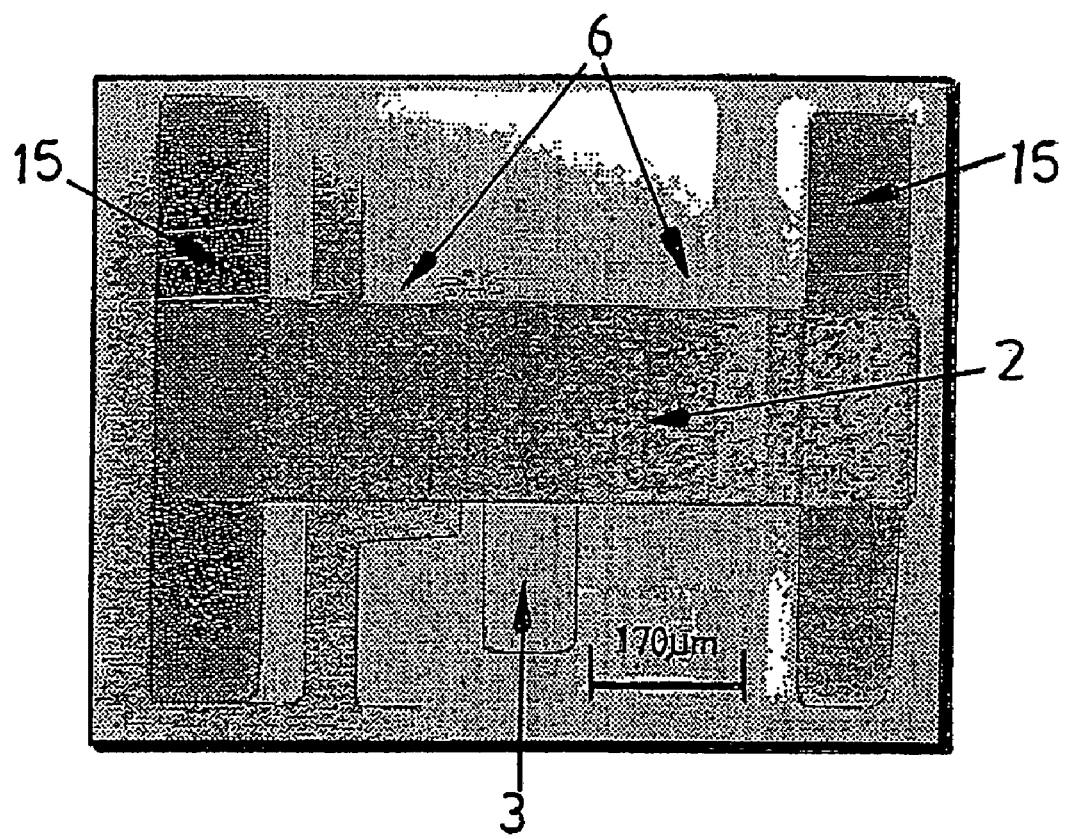
FIG. 4 is a microscope image of the variable capacitor of the present invention.
Figure 5:
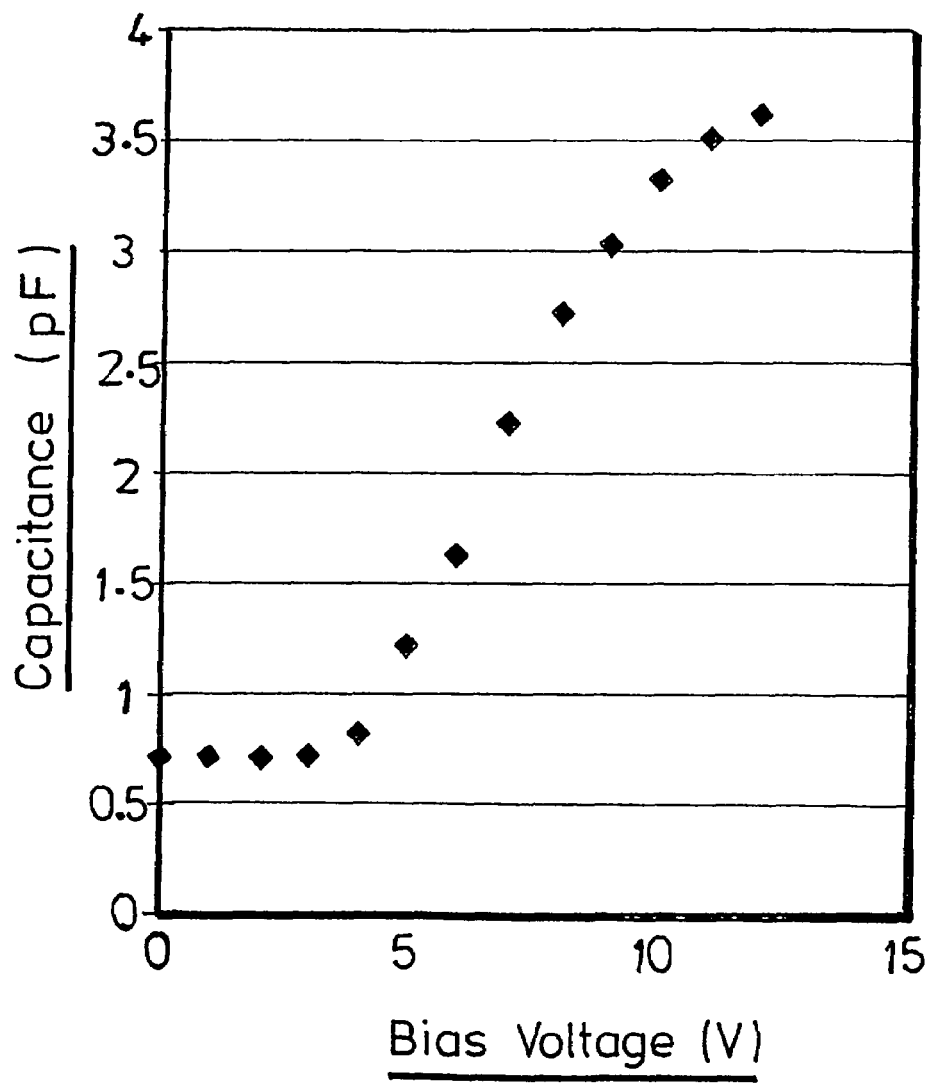
FIG. 5 is a graph illustrating the variation in capacitance against bias voltage for a capacitor having nickel electrodes, formed using the process of FIGS. 3a to 3g.

An image of the fabricated capacitor from above is shown in FIG. 4. It can be seen that the topography of the initially deposited nickel portion (FIG. 3a) has carried through to the upper surface of the upper electrode 2. The graph shown in FIG. 5 indicates the results of tests using a Boonton 72BD digital capacitance meter with a signal frequency of 1 MHz. For a DC bias voltage of 0V to 12V the measured capacitance ranges from 0.7 pF to 3.6 pF. This corresponds to a tuning ratio of 5.1:1. Moreover, the tendency for stiction between the plates is significantly reduced.

Mean roughness (Ra) of a surface can be represented as the arithmetic average of deviations from a centre plane. That is:

$$Ra = \frac{\sum_{i=1}^{N} |Z_i - Z_{cp}|}{N} \quad (1)$$

where:
$Z_{cp}$ is the Z value of the centre plane;
$Z_i$ is the Z value for point i; and
N is the number of points over which roughness is being measured.

Referring back to FIG. 1, four areas 17, 18, 19, 20 on the surfaces of the electrodes 2, 3, 6 are highlighted. The roughness of each of these areas is now discussed with reference to FIGS. 6 to 8.

Figure 6:
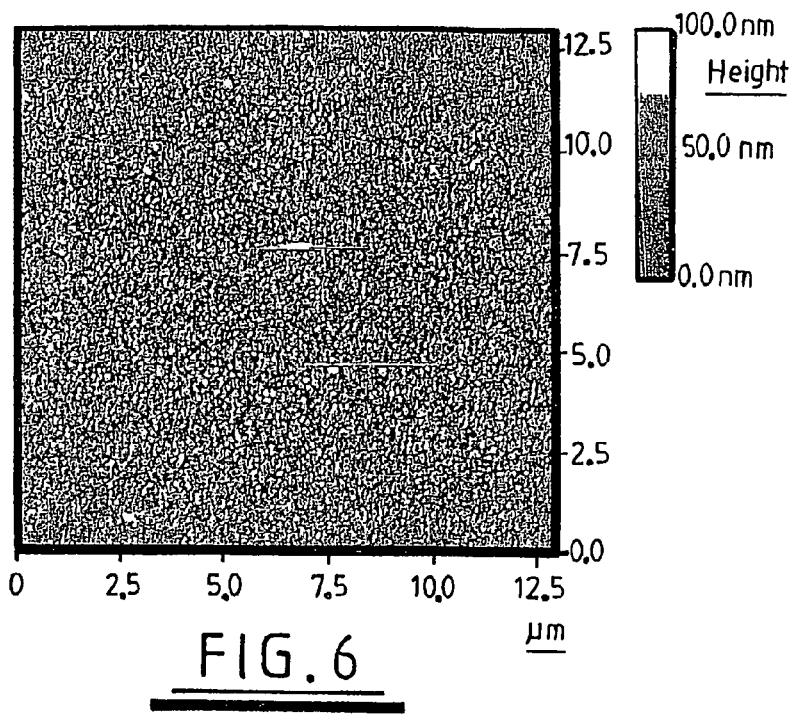
FIGS. 6 to 8 are microscope images showing surface roughness of various parts of electrodes of the capacitor of FIGS. 1 and 2.

FIG. 6 shows an atomic force microscope (AFM) image of an area 17 on the surface of the upper electrode 2. The localised roughness of the area shown in FIG. 6 is measured to be 73Å, using equation (1). The area 18 of the evaporated nickel biasing electrode 6 is measured to have a roughness of 6Å. Thus, the sacrificial titanium has introduced an additional surface roughness to the area 17 of the electrode 2, as compared with roughness produced by controlling the electroplating process as described above. Thus, two dissimilar surfaces are provided.

Figures 7, 8:
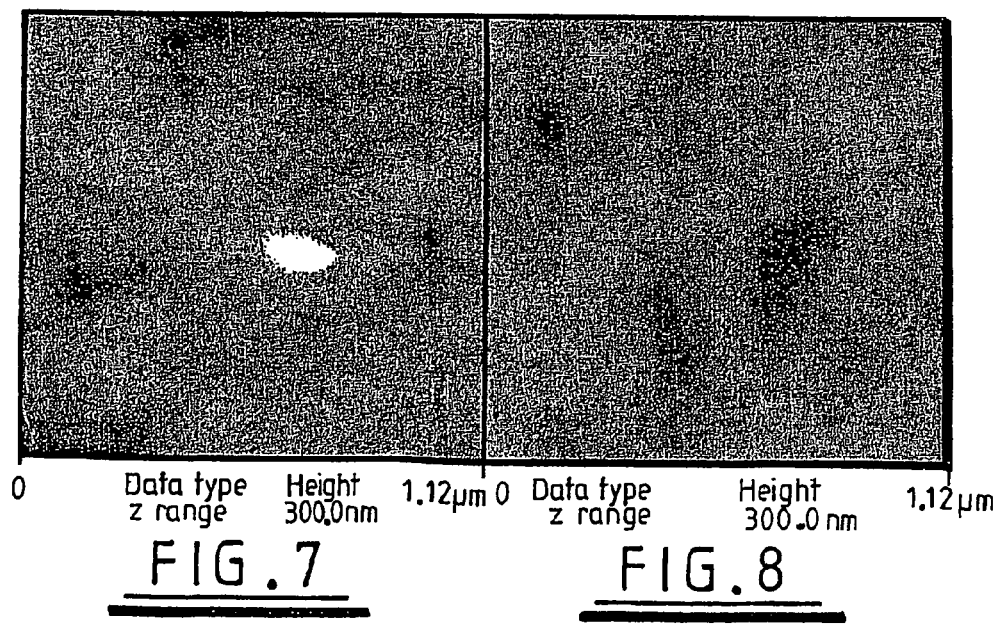

The lower electrode 3 is formed using electroplating of nickel onto the nickel seed. The sacrificial titanium cannot effectively planarise this surface roughness. It is important that the underside of the electrode 2 does not completely mesh with the topside of the electrode 3, so as to avoid stiction. FIG. 7 shows an AFM image of the area 19 on the upper surface of the electrode 3. FIG. 8 shows an AFM image of the area 20 on the lower surface of the electrode 2. The area shown in FIG. 7 has a smooth grain structure with a mean surface roughness of 230 Å (equation (1)). The area shown in FIG. 8 does not have the smooth grain structure as the localised roughness of the sacrificial titanium interacts with the topology of the electroplated metal. The mean surface roughness of the area shown in FIG. 8 is 173 Å.

From the preceding discussion it can be seen that two sources of roughening are responsible for producing dissimilar surfaces. First, evaporated sacrificial titanium is introducing localised roughening associated with its grain structure. Second, the use of electroplating (with controllable factors of the type described above) introduces a larger magnitude source of surface roughening.

The images of FIGS. 7 and 8 show the interaction between the two sources of surface roughening. It can be seen that the titanium sacrificial layer reduces the magnitude of the surface roughness associated with the electroplated metal. Hence the amplitude of the surface roughness in FIG. 7 is greater than that in FIG. 8.

Figure 9:
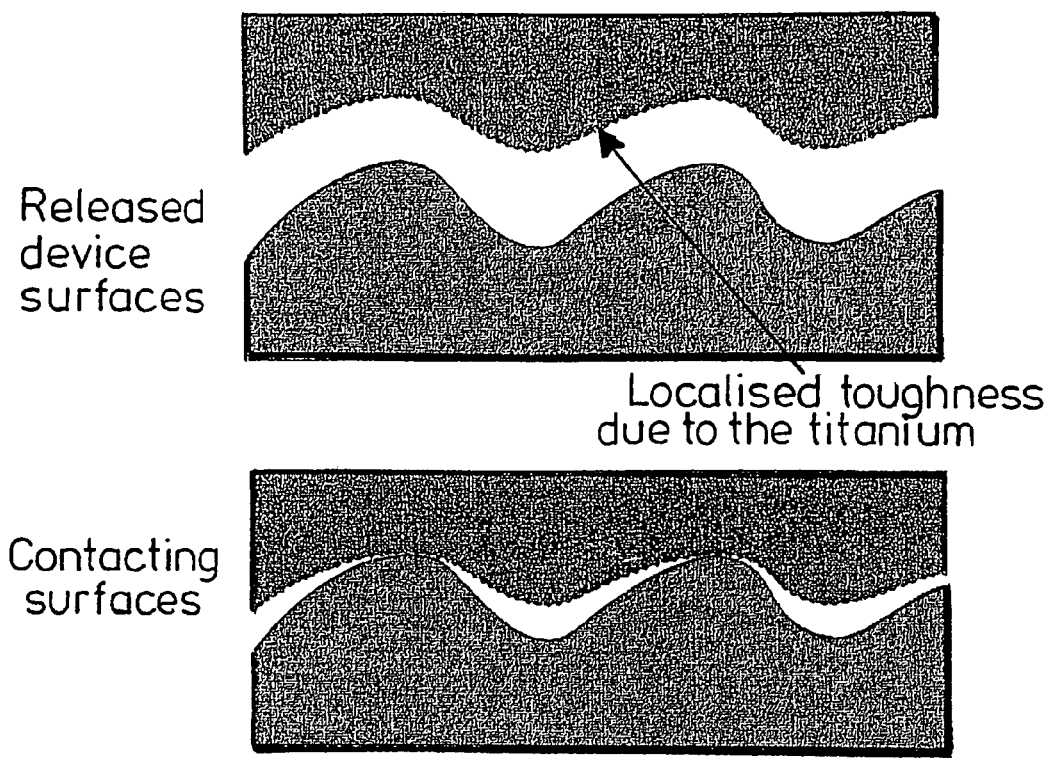
FIG. 9 is a schematic illustration of differences in roughness between upper and lower electrodes in the capacitor of FIGS. 1 and 2.

The factors described above combine to ensure that the surface topology of the underside of the electrode 2 differs from the surface topology of the upper surface of the electrode 3. Thus, the two electrodes can not fully mesh, and contact between the electrodes 2, 3 is reduced. This inability to fully mesh is illustrated in FIG. 9. Referring to FIG. 9 it can be seen that each of the upper and lower surfaces includes large scale roughness caused by electroplating, and that the upper surface additionally includes small scale roughness caused by the sacrificial titanium. The lower part of FIG. 9 shows that when the surfaces are brought together, they do not mesh, and surface contact between the two surfaces is minimal.

Using the techniques described above device yields of 90% have been achieved.

In alternative embodiments of the present invention, capacitors in which the upper and lower electrodes 2, 3 are formed from gold can be fabricated. Capacitors using gold electrodes are fabricated in a similar manner to that described with reference to FIGS. 3a to 3g, however, the anchor pads 11 of FIG. 3a and the bases for the electrodes 3, 6 are formed by e-beam evaporating 100 Å of chromium followed by 300 Å of gold.

Gold is electroplated to form the upper electrode 2 and its supports, and the lower electrode 3. This electroplating is carried out using Neutronex 309 electroless solution at 40° C. Plating at lower temperatures has been found to produce released electrodes which are buckled due to compressive stress. Unlike nickel, gold electroplates poorly onto titanium which is used as a sacrificial layer in the manner described above. Therefore, 100 Å of gold is evaporated on top of the second layer of titanium 14 (FIG. 3f) to act as a plating seed. This layer of gold is removed prior to etching of the titanium using hydrofluoric acid solution, in the manner described above.

Figure 10:
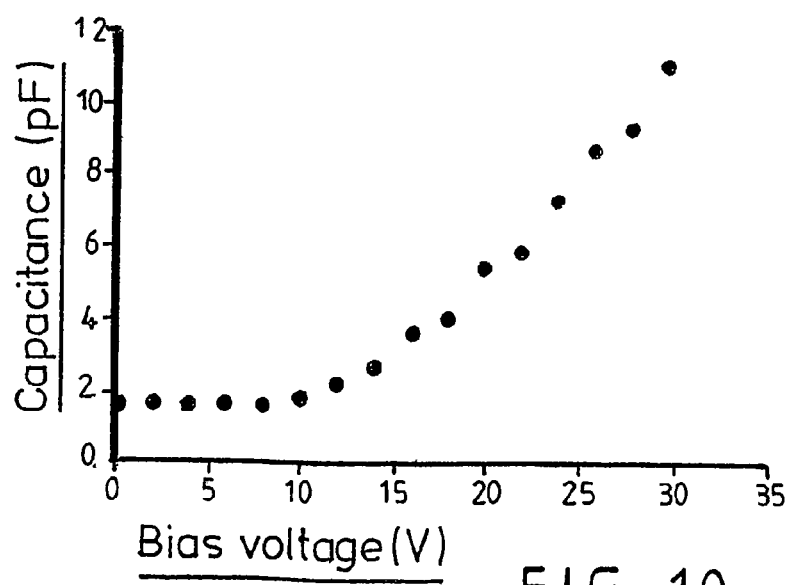
FIG. 10 is a graph illustrating the variation in capacitance against bias voltage for a capacitor in accordance with the present invention having gold electrodes.

FIG. 10 shows how applied voltage affects capacitance of a capacitor having gold electrodes. Gold devices exhibited a tuning ration of 7.3:1, from an initial capacitance of 1.5 pF, using a tuning bias of 0V to 30V. Thus, it can be seen that capacitors fabricated with gold electrodes are more tunable than those having nickel electrodes.

It will be appreciated that numerous modifications to the above described design may be made without departing from the scope of the invention as defined in the appended claims. For example, the roughened surface may be present on one or other of the central electrode or the underside of the upper electrode rather than both. Any process other than electroplating which results in the required roughness may be used. Moreover, the intermediate (sacrificial) layer between the central and upper electrodes may be fabricated from any suitable material other than titanium. If both electrodes are required to have a roughened surface then the material used should be non-planarising i.e. any roughness on the surface of the central electrode should be carried through to the upper surface of the intermediate layer. The invention may also be applied to a device in which the control voltage is applied between the two electrodes which are used to define the capacitor rather than as described above in which the control voltage is applied between one of those electrodes and a bias electrode.

What is claimed:
1. A micro-electromechanical variable capacitor comprising first and second capacitor plates defining facing surfaces which are spaced apart to define a gap, and means for applying a potential difference across the gap, at least one of the plates being movable relative to the other such that when a potential is applied across the gap the width of the gap is varied as a function of the applied potential so as to vary the capacitance of the capacitor, wherein the facing surface of at least one plate has a roughened surface, the degree of roughness being sufficient to prevent the facing surfaces adhering together.

2. A micro-electromechanical variable capacitor according to claim 1, wherein the means for applying a potential difference is configured to apply the potential difference across the facing surfaces of the plates.

3. A micro-electromechanical variable capacitor according to claim 1, wherein the first capacitor plate defines at least one control electrode, the means for applying a potential difference being configured to apply the potential difference across each or said at least one control electrode and said second capacitor plate.

4. A micro-electromechanical variable capacitor according to claim 3, wherein the first capacitor plate defines an active electrode on which said facing surfaces is defined.

5. A micro-electromechanical variable capacitor according to claim 4, wherein the gap between the active electrode and the second capacitor plate is less than that between each of said at least one control electrode and said second capacitor plate.

6. A micro-electromechanical variable capacitor according to claim 1, wherein the second capacitor plate is moveable and the first capacitor plate is fixed.

7. A micro-electromechanical variable capacitor according to claim 6, wherein the second plate is flexible and is movable by virtue of its flexibility.

8. A micro-electromechanical variable capacitor according to claim 7, wherein the second plate comprises a pair of anchor members that are fixed relative to the first plate and an intermediate portion that is flexible and moveable.

9. A micro-electromechanical variable capacitor according to claim 8, wherein the intermediate portion of the second plate is substantially planar.

10. A micro-electromechanical variable capacitor according to claim 1, wherein the facing surface of the first plate has a roughened surface.

11. A micro-electromechanical variable capacitor according to claim 1, wherein the facing surface of the second plate has a roughened surface.

12. A micro-electromechanical variable capacitor according to claim 11, wherein the roughened surface of the facing surface of the second plate is dissimilar to the roughened surface of the facing surface of the first plate.

13. A micro-electromechanical variable capacitor according to claim 12, wherein the dissimilarity is at least in part caused by the action of a sacrificial material used in the fabrication process.

14. A micro-electromechanical variable capacitor according to claim 13, wherein at least the facing surface of the second plate with a roughened surface is fabricated from electroplated nickel or gold.

15. A method for fabricating a micro-electromechanical variable capacitor having first and second capacitor plates defining facing surfaces which are spaced apart to define a gap, and means for applying a potential difference across the gap, at least one of the plates being movable relative to the other such that when a potential is applied across the gap the width of the gap is varied as a function of the applied potential so as to vary the capacitance of the capacitor, the method comprising the step of fabricating at least one plate with a roughened facing surface, the degree of roughness being sufficient to prevent the facing surfaces adhering together.

16. A method according to claim 15, wherein at least the facing surface of the first plate is fabricated by electroplating.

17. A method according to claim 15, wherein at least the facing surface of the second plate is fabricated by electroplating.

18. A method according to claim any one of claims 15, wherein said first capacitor plate is fabricated to have at least one control electrode, the means for applying a potential difference being configured to apply the potential difference across each of said at least one control electrode and said second capacitor plate.

19. A method according to claim 15, further comprising the steps of fabricating the first plate with a roughened surface, fabricating an overlying intermediate layer such that the roughness of the facing surface is repeated on an upper surface of the intermediate layer and then fabricating the second plate over the intermediate layer such that its facing surface is formed with an inverse of the upper surface of the intermediate layer, and then removing the intermediate layer.

20. A method according to claim 19, wherein said intermediate layer is removed by etching.

21. A method according to any one of claims 19, wherein the intermediate layer is a sacrificial layer fabricated from titanium.

22. A method according to claim 19, wherein the sacrificial layer introduces further roughness to the facing surface of the second plate.

23. A method according to claim 22, wherein the first capacitor plate is fabricated to have an active electrode on which said facing surface is defined.

* * * * *

UNITED STATES PATENT AND TRADEMARK OFFICE
CERTIFICATE OF CORRECTION

PATENT NO.         : 7,440,254 B2
APPLICATION NO. : 10/518737
DATED              : October 21, 2008
INVENTOR(S)        : Andrew James Gallant It is certified that error appears in the above-identified patent and that said Letters Patent is hereby corrected as shown below:

In column 7, at lines 41-42, change "according to claim 1" to --according to claim 9--

In column 7, at lines 44-45, change "according to claim 1" to --according to claim 10--

In column 8, at line 25, delete "claim any one of"

In column 8, at line 41 delete "claim any one of"

Signed and Sealed this

Nineteenth Day of January, 2010

David J. Kappos
*Director of the United States Patent and Trademark Office*